US008046046B2

(12) United States Patent
Chan et al.

(10) Patent No.: US 8,046,046 B2
(45) Date of Patent: Oct. 25, 2011

(54) RF ARRAY COIL SYSTEM AND METHOD FOR MAGNETIC RESONANCE IMAGING

(75) Inventors: Pei H. Chan, Aurora, OH (US); Labros Petropoulos, Burton, OH (US)

(73) Assignee: General Electric Company, Schenectady, NY (US)

( * ) Notice: Subject to any disclaimer, the term of this patent is extended or adjusted under 35 U.S.C. 154(b) by 2033 days.

(21) Appl. No.: 10/828,157

(22) Filed: Apr. 20, 2004

(65) Prior Publication Data

US 2005/0107686 A1  May 19, 2005

Related U.S. Application Data

(60) Provisional application No. 60/523,774, filed on Nov. 19, 2003.

(51) Int. Cl.
*A61B 5/05* (2006.01)

(52) U.S. Cl. ........ 600/422; 600/407; 600/410; 324/307; 324/309; 324/318; 333/219; 333/220; 333/235; 333/221; 333/222

(58) Field of Classification Search ............ 324/307, 324/309, 318; 600/410, 422, 407; 333/219–235
See application file for complete search history.

(56) References Cited

U.S. PATENT DOCUMENTS

| 5,594,337 | A  | * | 1/1997 | Boskamp | 324/318 |
| 6,577,888 | B1 | * | 6/2003 | Chan et al. | 600/422 |
| 6,591,128 | B1 | * | 7/2003 | Wu et al. | 600/422 |
| 6,798,206 | B2 | * | 9/2004 | Misic | 324/322 |
| 7,345,483 | B2 | * | 3/2008 | Vaughan | 324/318 |

OTHER PUBLICATIONS

C.L. Dumoulin et al., A 32-Channel Coil for Phased Array Imaging at 1.5 Tesla, Proc. Intl. Soc. Mag. Reson. Med. 11 (2003), 431.
Boskamp et al., A 16 Channel Neurovascular Sense Array, Proc. Intl. Soc. Mag. Reson. Med. 10 (2002).
Pruessmann, et al., Sense: Sensitivity Encoding for Fast MRI, Magnetic Resonance in Medicine 42 (1999) 952-962.
Sodickson, et al., Simultaneous Acquisition of Spatial Harmonics (SMASH): Fast Imaging with Radiofrequencey Coil Arrays, MRM 38 (1997) 591-603, Williams & Wilkins.

* cited by examiner

*Primary Examiner* — Brian Casler
*Assistant Examiner* — Joel Lamprecht
(74) *Attorney, Agent, or Firm* — Dean Small; The Small Patent Law Group

(57) ABSTRACT

A RF array coil system and method for magnetic resonance imaging are provided. The array coil system includes an anterior coil section having a main anterior coil section and at least one secondary anterior coil section removably attachable to the main anterior coil section. The array coil system further includes a posterior coil section having a main posterior coil section and at least one secondary posterior coil section removably attachable to the main posterior coil section.

20 Claims, 17 Drawing Sheets

RF ARRAY COIL SYSTEM AND METHOD FOR MAGNETIC RESONANCE IMAGING

CROSS REFERENCE TO RELATED APPLICATIONS

This application claims priority to and the benefit of the filing date of U.S. Provisional Application No. 60/523,774 filed on Nov. 19, 2003 and which is hereby incorporated by reference in its entirety.

BACKGROUND OF THE INVENTION

This invention relates generally to Magnetic Resonance Imaging (MRI) systems, and more particularly, to a Radio-Frequency (FR) coils in such MRI systems.

Magnetic Resonance Imaging (MRI) utilizes hydrogen nuclear spins of the water molecules in the human body, which are polarized by a strong, uniform, static magnetic field of a magnet. This magnetic field is commonly referred to as $B_0$ or the main magnetic field. The magnetically polarized nuclear spins generate magnetic moments in the human body. The magnetic moments point in the direction of the main magnetic field in a steady state, but produce no useful information if these magnetic moments are not disturbed by any excitation.

The generation of Nuclear Magnetic Resonance (NMR) signals for MRI data acquisition is accomplished by exciting the magnetic moments with a uniform Radio-Frequency (RF) magnetic field. This RF magnetic field is commonly referred to as the $B_1$ field or the excitation field. The $B_1$ field is produced in the imaging region of interest by an RF transmit coil that is usually driven by a computer-controlled RF transmitter with a power amplifier. During excitation, the nuclear spin system absorbs magnetic energy and the magnetic moments precess around the direction of the main magnetic field. After excitation, the precessing magnetic moments will go through a process of Free Induction Decay (FID), releasing their absorbed energy and returning to the steady state. During FID, NMR signals are detected by the use of a receive RF coil, which is placed in the vicinity of the excited volume of the human body.

The NMR signal is the secondary electrical voltage (or current) in the receive RF coil that has been induced by the precessing magnetic moments of the human tissue. The receive RF coil can be either the transmit coil operating in a receive mode or an independent receive-only RF coil. The NMR signal is used for producing MR images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system that generate magnetic fields in the same direction of the main magnetic field, and varying linearly in the imaging volume.

In MRI, it is desirable for the excitation and reception to be spatially uniform in the imaging volume for better image uniformity. In known MRI systems, the best excitation field homogeneity is usually obtained by using a "whole-body" volume RF coil for transmission. The "whole-body" transmit coil is the largest RF coil in the system. A large coil, however, produces lower signal-to-noise ratio (SNR or S/N) if it is also used for reception, mainly because of its greater distance from the signal-generating tissues being imaged. Because a high signal-to-noise ratio is very desirable in MRI, special-purpose coils have been used for reception to enhance the S/N ratio from the volume of interest. In practice, a well-designed specialty or special-purpose RF coil has the following functional properties: high S/N ratio, good uniformity, high unloaded quality factor (Q) of the resonance circuit, and high ratio of the unloaded to loaded Q factors. Additionally, the coil should be mechanically designed to facilitate patient handling and comfort, as well as to provide a protective barrier between the patient and the RF electronics.

Another known method to increase the SNR is by quadrature reception. In this method, NMR signals are detected in two orthogonal directions, which are in the transverse plane or perpendicular to the main magnetic field. The two signals are detected by two independent individual coils that cover the same volume of interest. With quadrature reception, the SNR can be increased by up to, for example, $\sqrt{2}$ over that of the individual linear coils.

Sensitivity Encoding (SENSE) is a technique for reducing imaging time, thereby increasing imaging speed. In the SENSE technique, the spatial sensitivity information provided by the coil elements of a multiple-coil array system in real space can be used to substitute for the information provided by the encoding gradient in the k-space. By skipping some k-space lines, thereby saving imaging time, and using the spatial sensitivity information provided by each of the coil elements, an artifact-free full field of view (FOV) image can be reconstructed. For example, by eliminating two-thirds of the k-space lines (e.g., tripling the distance between two adjacent k-space lines), the imaging time may be reduced by about two-thirds (e.g., reduction factor=3).

Tripling the distance between two adjacent k-space lines also will result in a reduction of FOV in the imaging space to one-third of its original full FOV size. Therefore, the image intensity of each pixel inside the reduced FOV image will be the superposition of the image intensity of three pixels at three different locations in the full FOV image. With information about the spatial sensitivity profile of each coil element of a multiple-coil array system (at least three coil elements are needed) in the full FOV image and information relating to the forming of the reduced FOV image, the superimposed intensities can be separated for each pixel inside the reduced FOV image by solving a set of linear equations. Transferring the separated intensities of the three pixels back to their original locations and performing the same procedures for all the pixels inside the reduced FOV image results in a reconstructed original full FOV image. In order to perform SENSE imaging, the coil elements of an array coil system must distribute along the phase encoding directions.

In MRI and Magnetic Resonance Angiography (MRA), a neurovascular RF coil is typically used as a general-purpose coil for the head, neck/c-spine and vascular imaging without repositioning a patient. The coverage of a neurovascular coil, depending on the usable imaging volume (e.g., a sphere of forty-five to fifty centimeters (cm) in diameter) of known MRI systems, is about forty-eight cm from the top of the head to the aortic arch. The performance (e.g., SNR) and image uniformity of a neurovascular coil should be comparable to a conventional head coil for head imaging and to a stand-alone neck coil for neck/c-spine imaging. For vascular imaging, a neurovascular coil should be able to provide homogeneous images for coverage of the blood vessels from the Circle of Willis to the aortic arch. For head and vascular SENSE imaging, the sensitivity encoding needs to be performed in all the three directions, and specifically, in the left-right, anterior-posterior and superior-inferior directions.

To cover the head and neck with a single RF coil, an asymmetric birdcage coil is known. This coil includes anterior and posterior parts of a typical birdcage head coil, but is extended further over the neck and chest regions to provide coverage for these regions. The asymmetric birdcage coil is operated in quadrature mode for head and neck imaging. The enlargement of the birdcage head coil reduces the performance (e.g., SNR) of the head section of the asymmetric birdcage coil as compared to a conventional birdcage head coil. The anterior neck-torso coil section also is located a substantial distance from a patient's chest and the shape is often not optimized to fit the human neck-chest contour. Thus, the performance of the neck-torso section of the asymmetric birdcage coil is lower than that of the head section. The SNR drops quickly from the neck region to the chest region. This limits the coverage of the asymmetric birdcage coil, for example, to only the head and neck and not to the aortic arch.

It is also known to extend the coverage to the aortic arch using a quadrature RF coil for neurovascular imaging and spectroscopy of the human anatomy. This neurovascular coil utilizes multiple horizontal conductors and end conductors to distribute the current such that two orthogonal magnetic modes, and more particularly, one horizontal field and one vertical field, are created by the coil to achieve the quadrature detection of magnetic resonance signal. The neurovascular coil is separated into two shells, and specifically an upper shell for the anterior conductors and lower shell for the posterior conductors. These two shells may be connected by a hinge at the middle of the top end of the head coil mechanical housing. This coil arrangement may be used as a single coil for covering the entire FOV from the top of the head to the aortic arch. The anterior chest coil section also is attached to the anterior head coil and located a distance from a patient's chest. Thus, this neurovascular coil also results in lower performance, for example, lower SNR for the head imaging as compared to a conventional quadrature head coil and imaging non-uniformity of the chest region due to the quick SNR drop-off in this region.

Other coils arrangements are also known to allow imaging of a large field-of-view (FOV) while maintaining the SNR characteristic of a small and conformal coil. For example, a two-channel (four linear coils) volume array coil for magnetic resonance angiography of the head and neck is known. In this coil arrangement the first channel is a four bar quadrature head coil including two linear coils. Two Helmholtz type coils form the second channel for covering the neck and chest. The two Helmholtz type coils are arranged such that the magnetic fields generated are diagonally oriented and perpendicular to each other (i.e., a quadrature coil pair). The quadrature neck coil is attached to the quadrature head coil. Each of the two Helmholtz type neck coils overlap with the head coil to minimize the inductive coupling between the head and neck coils. The coverage of this two-channel quadrature volume array coil is limited to the head and neck and cannot image, for example, the aortic arch.

A split-top, four channel, birdcage type array coil also is known for head, neck and vascular imaging. This split-top head and neck coil includes a birdcage head coil and two distributed type (flat birdcage type) coils, one for the anterior neck-torso and the other for the posterior neck-torso. The quadrature signal obtained with the head coil is separated into two channels. The anterior and posterior neck-torso coils form the other two channels. The housing of the head and neck coil is divided into two parts, and specifically, a lower housing for the posterior one-half of the head coil and the posterior neck-torso coil and an upper housing for the anterior one-half of the head coil and the anterior neck-torso coil. The upper housing is removable providing a split top. Inductive coupling between the neck-torso coils and the head coil is minimized by overlapping the neck-torso coils with the head coil. The anterior neck-torso coil of the four channel vascular coil also is attached to the anterior head coil and located a distance from a patient's chest. Thus, a signal drop-off at the chest region results. Further, the decoupling of the multiple modes (i.e., multiple NMR frequencies) birdcage type anterior and posterior neck-torso coils from the multiple modes birdcage head coil is complex in design.

Neurovascular coils with a combination of a birdcage head coil and surface torso coils also are known. The performance of the head section of these neurovascular coils is lower than conventional standard birdcage head coils because of the design limitations. Further, other neurovascular coils are known and include multiple coils, for example, three volume-type coils and four or five surface coils. In these coil arrangements, two volume saddle coils are provided on a dome-shaped head coil former for brain imaging. Another two shaped saddle coils, one volume-type and the other surface-type, are used for the inferior portion of head and neck imaging. The torso section includes a loop-saddle quadrature pair for the posterior torso region and one or two loop coils for the anterior torso region. These coil arrangements again have design limitations.

These known coils not only have design limitations, but when used in SENSE operations, imaging in both the left-right (LR) and anterior-posterior (AP) directions is not possible in the head region. The complex sensitivity of the head coil elements does not allow for SENSE imaging to be performed.

SENSE imaging for neurovascular applications are known, such as a 16-channel neurovascular-SENSE array coil. This coil arrangement includes sixteen loop coils with eight bent loop coils for the head region and the other eight rectangular loop coils for the torso region. The eight head loop coils are constructed on a cylindrical former and tapered at the top of head region. The eight torso loop coils are separated into two sections with four for the anterior torso section and the other four for the posterior torso section. The four loop coils of each section are constructed on a planar former and arranged in the left-right direction. Each loop coil is separated from its adjacent coils by a gap and inductive coupling between adjacent coils is minimized using transformers. Thus, a 16-channel neurovascular-SENSE coil having a three-section arrangement is provided (e.g., head, anterior torso and posterior torso sections). However, signal drop-off may be experienced between the head and torso regions, which causes shading at the neck region. Further, as the number of coil elements increases for each of the head and torso regions, the size of each coil element decreases correspondingly. This further results in shading problems at the neck region. Additionally, this arrangement does not facilitate parallel imaging in the superior-inferior direction in the head region and in the torso region.

BRIEF DESCRIPTION OF THE INVENTION

In one embodiment, a MRI array coil system is provided. The MRI array coil system includes an anterior coil section having a main anterior coil section and at least one secondary anterior coil section removably attachable to the main anterior coil section. The MRI array coil system further includes a posterior coil section having a main posterior coil section and at least one secondary posterior coil section removably attachable to the main posterior coil section.

In another embodiment, a method for controlling an MRI system is provided. The method includes configuring an anterior coil section to have a main anterior coil section and at least one secondary anterior coil section removably attachable to the main anterior coil section. The method further includes configuring a posterior coil section to have a main posterior coil section and at least one secondary posterior coil section removably attachable to the main posterior coil section.

DETAILED DESCRIPTION OF THE INVENTION

Figure 1:
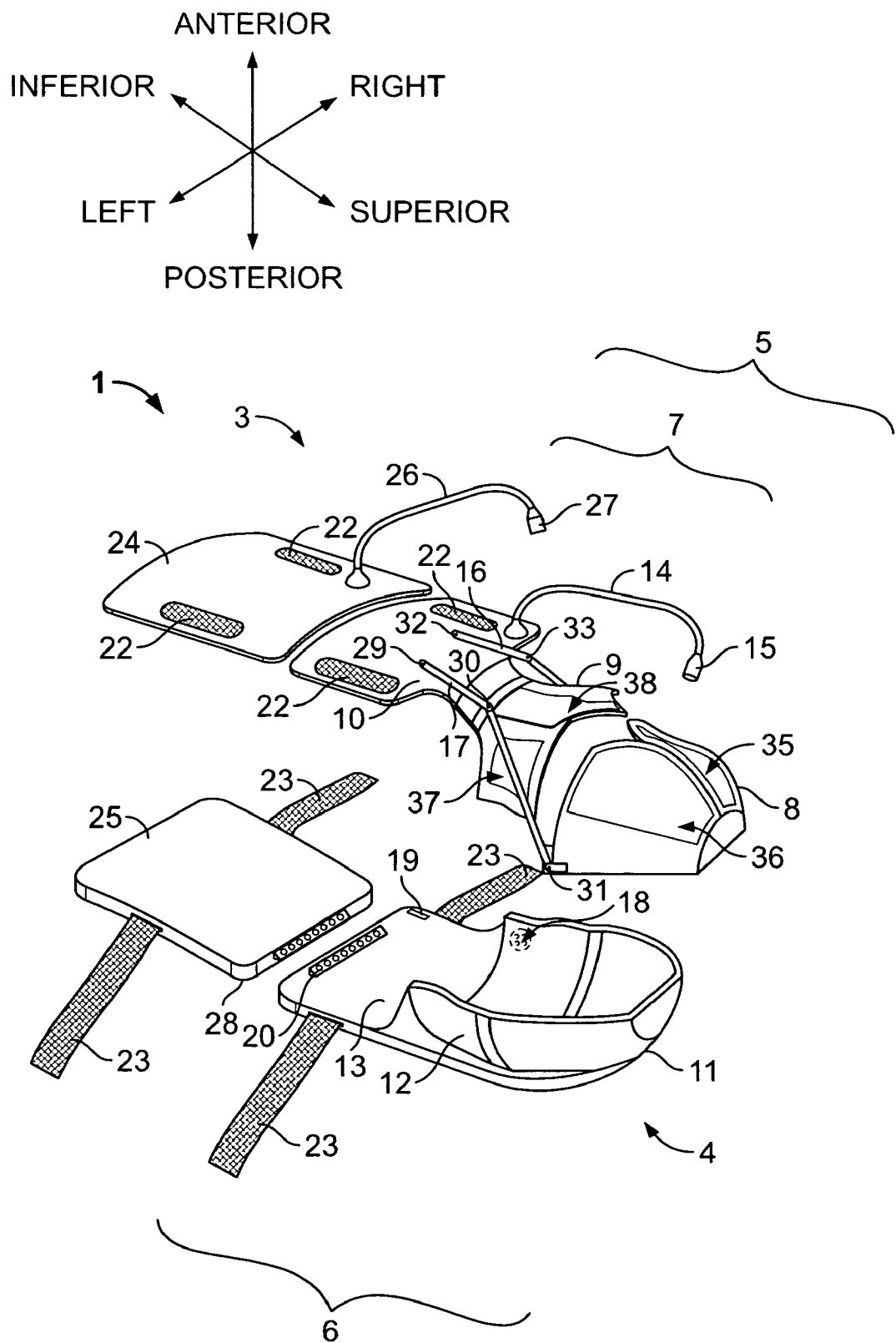
FIG. 1 is a perspective view of a RF array coil system in accordance with an exemplary embodiment of the present invention.
Figure 5:
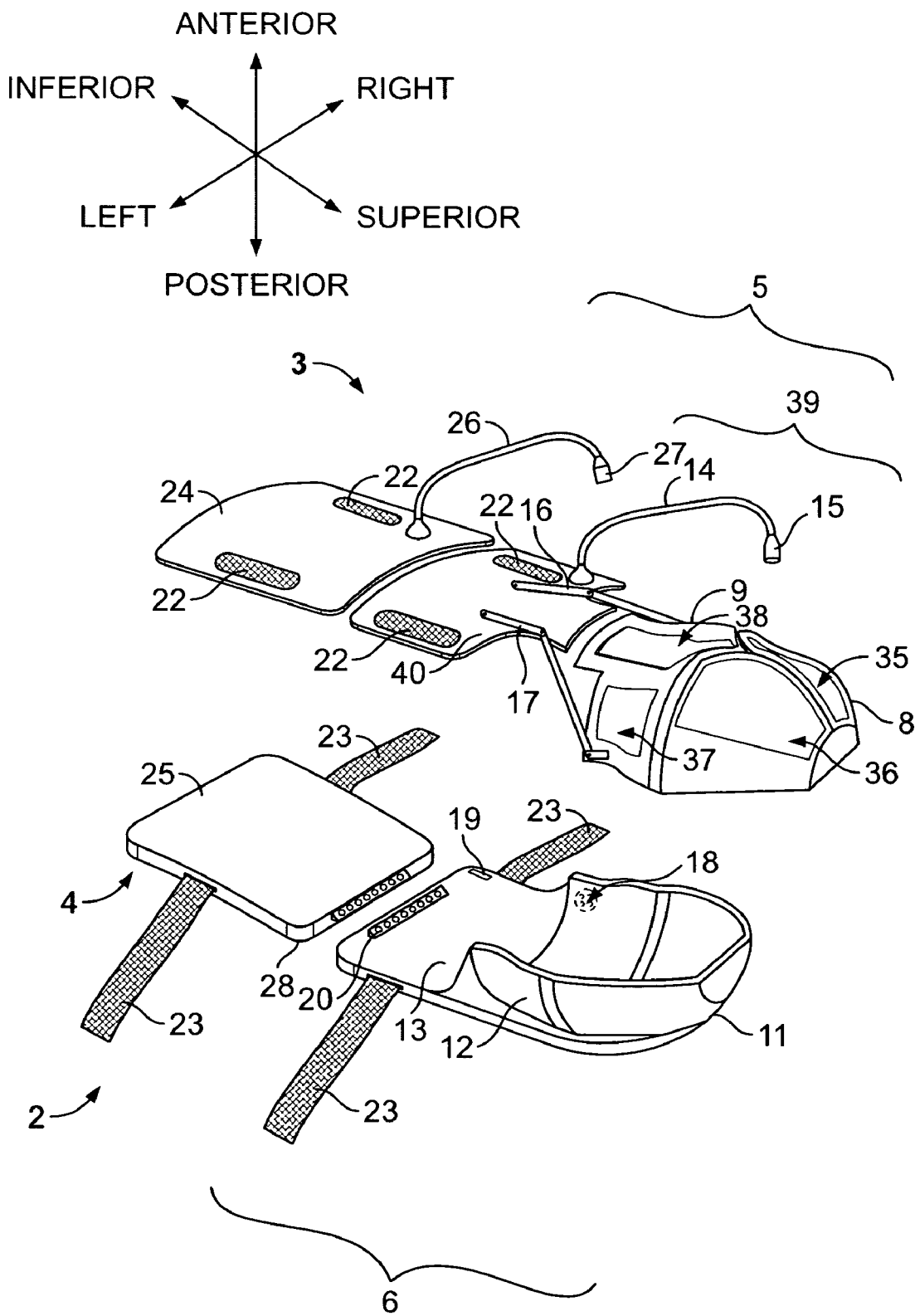
FIG. 5 is a perspective view of a RF array coil system in accordance with another exemplary embodiment of the present invention.

Various embodiments of the present invention provide a RF array coil system as shown generally in FIGS. 1 and 5. Referring first to FIG. 1, the RF array coil system 1 of present invention includes an anterior coil section 3 and a posterior coil section 4. The anterior coil section 3 includes a main anterior coil section 5 and a secondary anterior coil section 24. The main anterior coil section 5 further includes a generally dome-shaped anterior brain coil section 8 that may be provided, for example, on a rigid former and a separate anterior neck-torso coil section 7 having an anterior neck coil 9 and an anterior torso coil 10, which may, for example, be provided on a flexible/semi-flexible former. The secondary anterior coil section 24 also may be provided, for example, on a flexible/semi-flexible former.

The posterior coil section 4 includes a main posterior coil section 6 and a secondary posterior coil section 25. The main posterior coil section 6 further includes a dome-shaped posterior brain coil section 11, a posterior neck coil section 12 and a posterior torso coil section 13. These three posterior coil sections 11, 12, 13 may be provided, for example, on a rigid former. The secondary posterior coil section 25 also may be provided, for example, on a rigid former. The anterior neck-torso coil section 7 may be attached to the dome-shaped anterior coil housing, as shown in FIG. 1, or to the main posterior coil housing (not shown) by connection members, for example, a pair of mechanical arms 16 and 17. In one embodiment, there are three pivot points on each arm, and more specifically, pivot points 29, 30 and 31 on arm 17 and similar pivot points (not shown) on the arm 16. These pivot points allow the arms 16 and 17 and, hence, the anterior neck-torso coil section 7 to move in the superior-inferior direction, the anterior-posterior direction and to be tilted, for example, between an angle of about zero degrees to about ninety degrees. The anterior brain coil section 8, as shown in FIG. 2, includes connection members, such as, for example, two rigid hooks 45 and 46 that engage into another pair of hooks inside the main posterior coil housing through two openings 120 and 122 and then is secured onto the main posterior coil housing by a pair of locking members, such as, for example, latches 48 and 49.

The anterior neck-torso coil section 7 may be positioned on a patient's chest and/or neck and may be supported by the pair of the arms 16 and 17, and further secured on the patient's body by additional securing members, such as, for example, two pairs of belts 23 and pads 22, as shown in FIG. 1. The belts and pads may attach by any suitable means, such as, for example, with hook and loop fasteners. The secondary anterior torso coil section 24 is a floating type design and may be secured on a patient's body by securing members, such as, for example, at least two pairs of belts 23 and pads 22. The electrical conductors of the anterior brain coil section 8 may be connected to those of the posterior brain coil section 11. In this embodiment, multiple pairs of connectors, such as, for example, male connectors 41 and female connectors 42 may be provided to connect the anterior and posterior conductors.

Figure 3:
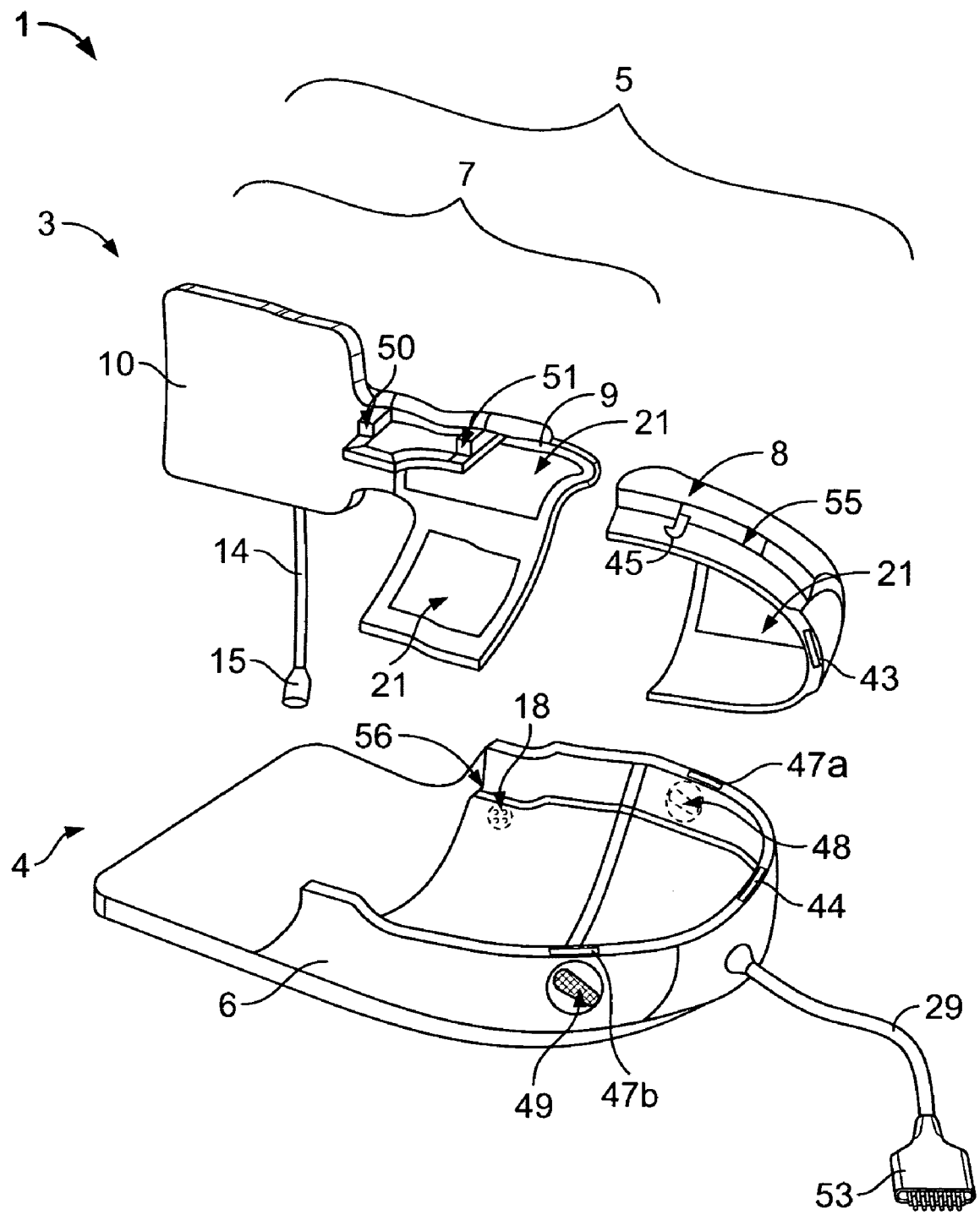
FIG. 3 is another perspective view of the RF array coil system shown in FIG. 1.
Figure 4:
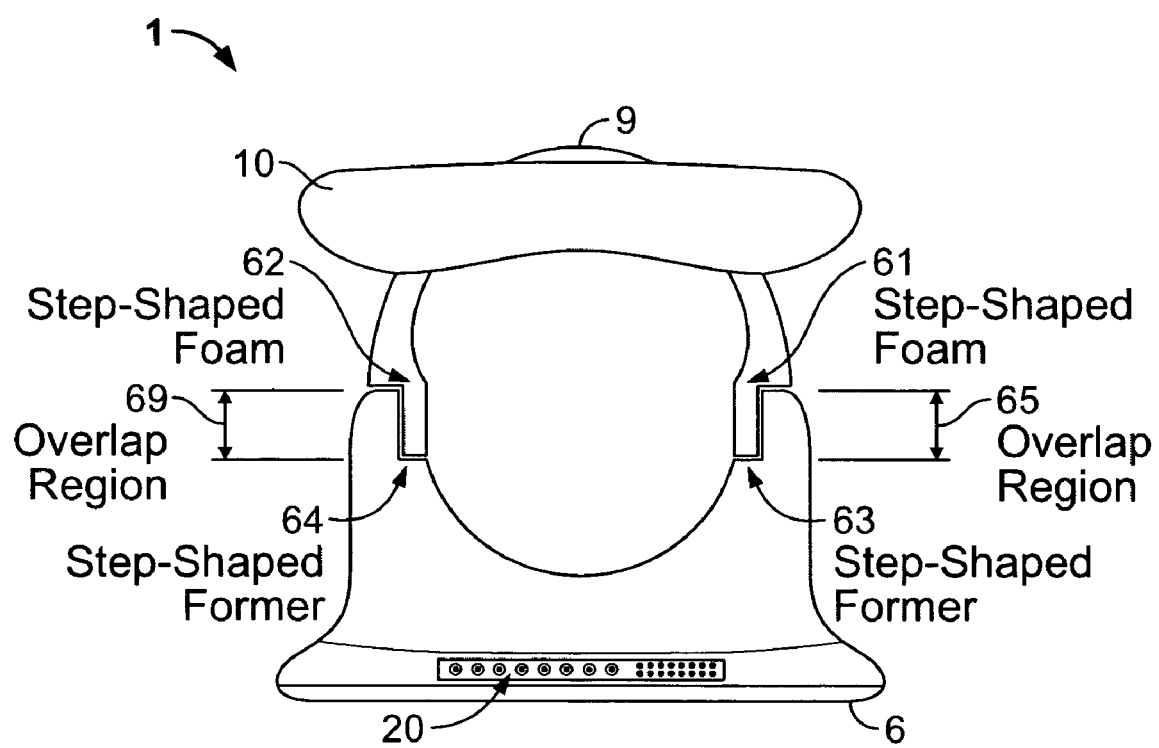
FIG. 4 is an elevation view of the RF array coil system shown in FIG. 1.

In another embodiment, the brain coil section may be provided such that the anterior brain coil elements are physically separate from those of the posterior brain coil. Specifically, no connectors are needed between the anterior and posterior brain coils. In this embodiment, the mutual inductance between the adjacent anterior and the posterior coil elements may be reduced by overlapping these anterior and posterior coil elements using a former, such as, for example, step-shaped mechanical formers 55 and 56 as shown in FIG. 3. The use of step-shaped formers 61, 62, 63, 64 as shown in FIG. 4 provides overlap regions 65 and 69 between the anterior coil and posterior coil. The overlap regions 65 and 69 may range, for example, from about one cm to about seven cm. In one embodiment, the anterior neck-torso coil elements are physically separate from those inside the main posterior coil housing such that no conductor connectors are needed between the anterior neck-torso and the main posterior coils. The mutual inductance reduction between the adjacent anterior and posterior neck coil elements is provided by overlapping these coil elements through step-shaped foam 50 and 51 and step-shaped rigid former 52 (shown in FIGS. 2 and 3) or step-shaped formers 61, 62, 63, and 64 (shown in FIG. 4). The overlap regions 65 and 69 may range, for example, from about one cm to about 7 cm.

Figure 2:
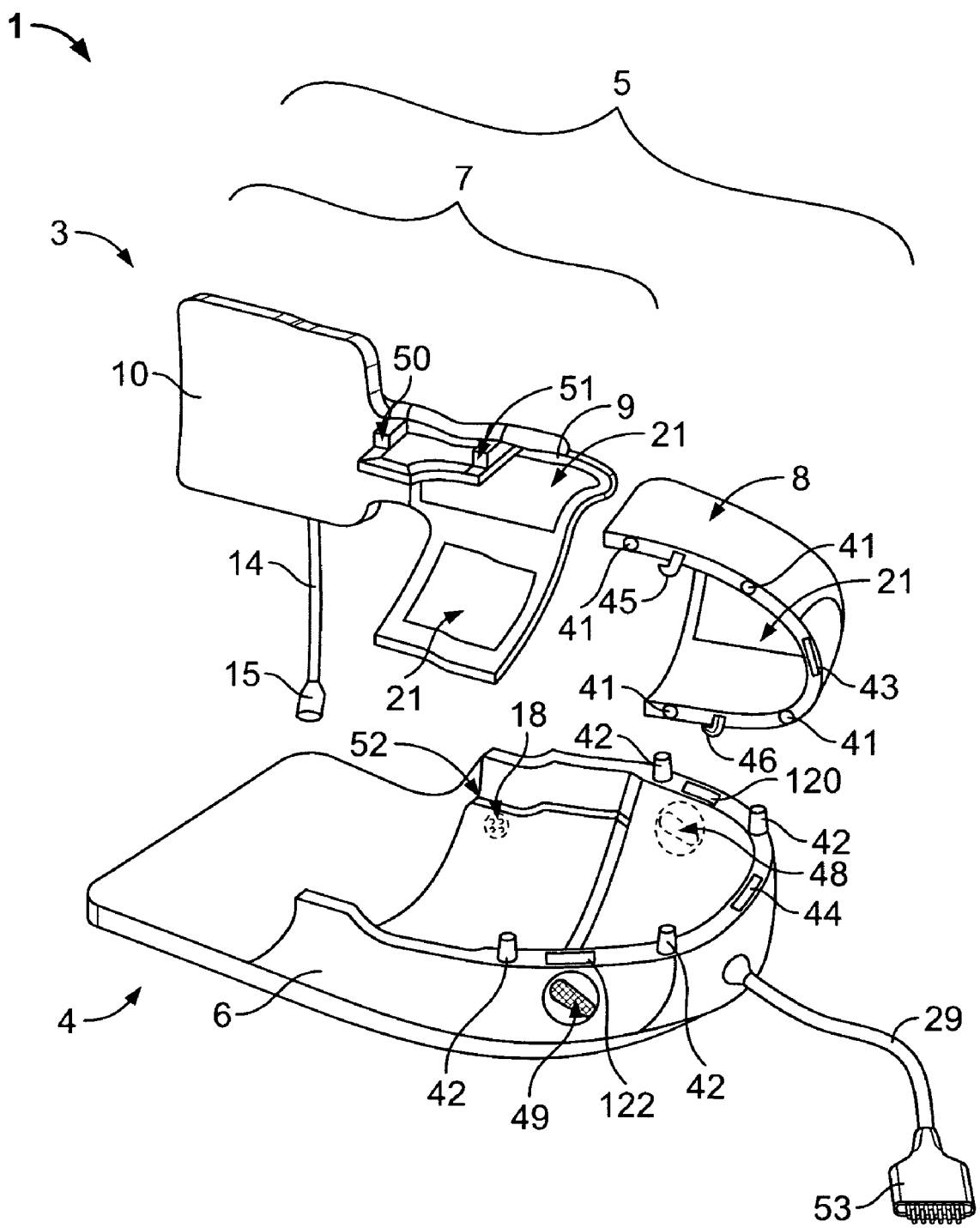
FIG. 2 is another perspective view of the RF array coil system shown in FIG. 1.

The RF signals and the DC lines of the anterior brain coil 8 may be electrically connected to the main posterior coil 6, as shown in FIG. 2, for example, via a pair of detachable multiple-pin/multiple-channel connectors 43 (e.g., connector) and 44 (e.g., receptacle of connector). The RF signals and the DC lines of the anterior neck-torso coil 7 may be electrically connected to the main posterior coil 6, for example, via a transition cable 14 and a pair of detachable connectors 15 (e.g., connector) and 18 (e.g., receptacle of connector). The secondary anterior torso coil 24 may be electrically connected to the main posterior coil 6, for example, via a transition cable 26 and a pair of detachable connectors 27 (e.g., connector) and 19 (e.g., receptacle of connector) (shown in FIG. 1). The secondary posterior coil 25 may be electrically connected to the main posterior coil 6, for example, via a pair of detachable connectors 28 (e.g., connector) and 20 (e.g., receptacle of connector). The RF signals and the DC lines of RF array coil system 1 may be electrically connected to a MRI scanner (not shown) via an output cable 29 and an output connector 53, as shown in FIGS. 2 and 3, or via multiple output cables and connectors (not shown).

Another embodiment of a RF array coil system 2 of the present invention is shown in FIG. 5, and also includes the main anterior coil section 5, the secondary anterior coil section 24, the main posterior coil section 6 and the secondary posterior coil section 25. Of these four sections, the main anterior coil section 5 is different from that in the RF array coil system 1, with the remaining the three sections the same as those in the RF array coil system 1. The main anterior coil section 5 includes an anterior brain-neck coil section 39 having the anterior brain coil 8 and an anterior neck coil 9, and which may be provided, for example, on a rigid former and a separate anterior torso coil section 40 provided on a flexible/semi-flexible former. The anterior brain-neck coil section 39 may have a pair of connection members, such as, for example, similar to the rigid hooks 45 and 46 shown in FIGS. 2 and 3, and may be secured onto the posterior coil housing 6 with, for example, securing members such as a pair of latches similar to the latches 48 and 49 shown in FIGS. 2 and 3. The anterior torso coil section 40 may be supported, for example, by the arms 16 and 17 or may be a floating type design that is secured on a patient's body by securing members, such as, for example, two pairs of belts 23 and pads 22. The belts 23 and pads 22 may attach by any suitable means, such as, for example, with hook and loop fasteners.

The electrical conductors of the anterior brain-neck coil may be connected to those of the main posterior coil using, for example, multiple pairs of male and female connectors similar to the connectors 41 and 42 shown FIG. 2. In another embodiment, the coil elements of the anterior brain-neck coil are physically separate from those of the main posterior coil and therefore no conductor connectors are needed between the anterior and posterior coils. In this embodiment, the step-shaped mechanical formers, similar to those shown in FIGS. 2, 3 and 4, may be used to allow the adjacent anterior and posterior coil elements to overlap to minimize the mutual inductance between two adjacent coil elements. The RF signals and the DC lines of the anterior brain-neck coil 39 may be electrically connected to the main posterior coil 6, for example, via a pair of detachable multiple-pin/multiple-channel connectors, similar to connectors 42 (e.g., connector) and 43 (e.g., receptacle of connector) shown in FIG. 2. The RF signals and the DC lines of the anterior torso coil 40 may be electrically connected to the main posterior coil 6, for example, via the transition cable 14 and the pair of detachable connectors 15 (e.g., connector) 18 (e.g., receptacle of connector). The RF signals and the DC lines of RF array coil system 2 may be electrically connected to a MRI scanner (not shown) via the output cable 29 and output connector 53 or via multiple output cables and connectors (not shown).

Figure 6:
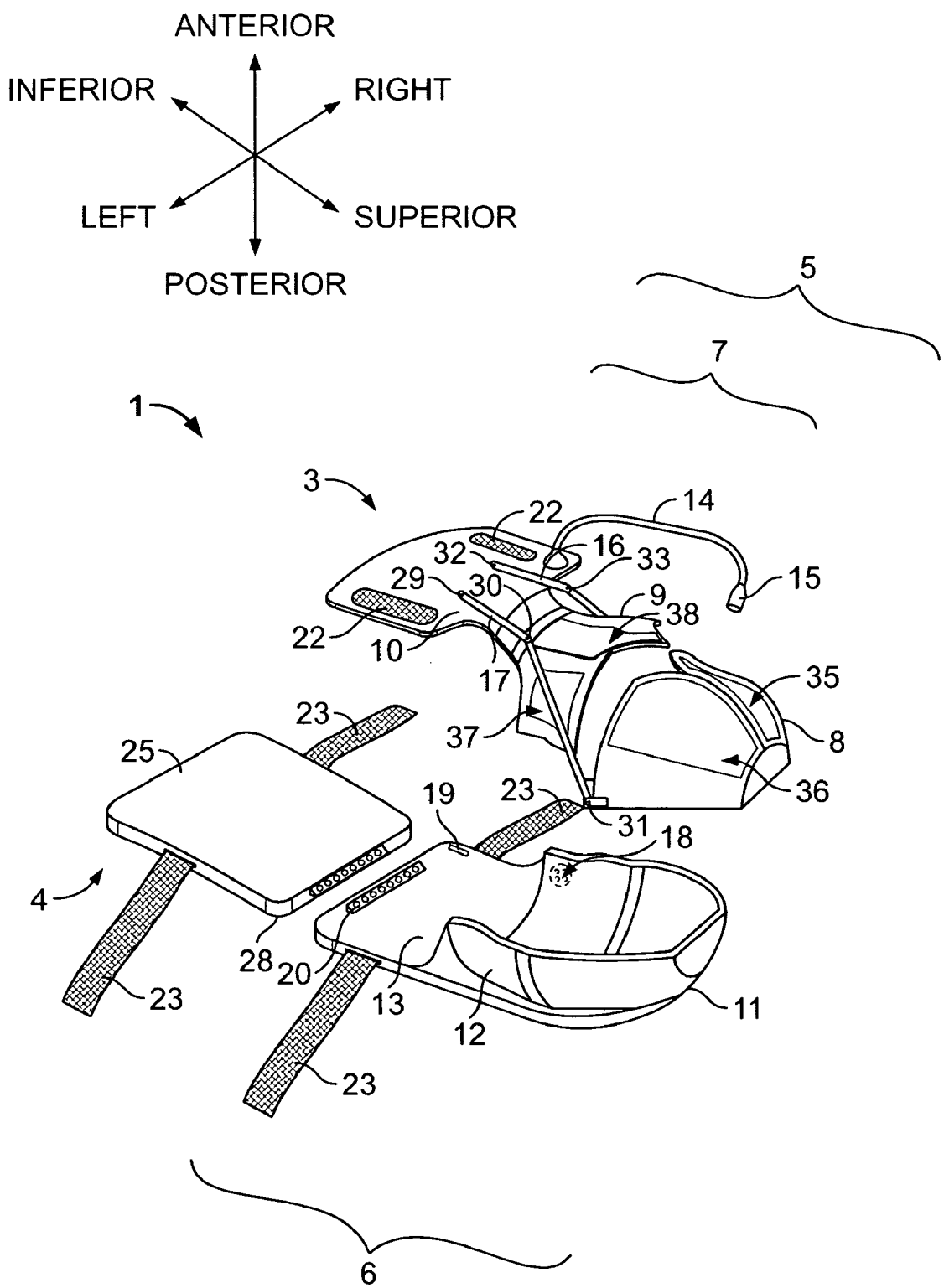
FIG. 6 is a perspective view of a RF array coil system in accordance with another exemplary embodiment of the present invention.
Figure 7:
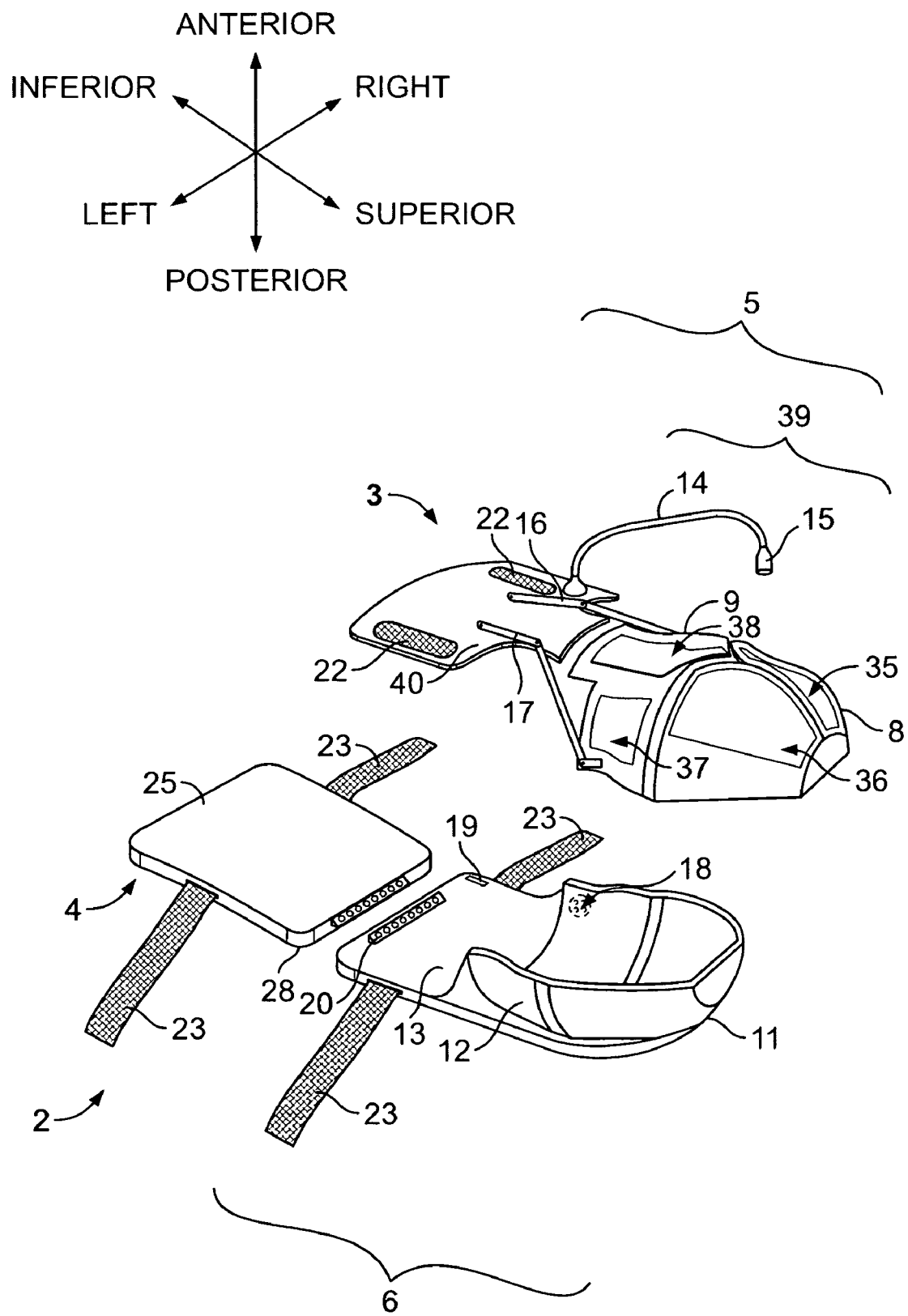
FIG. 7 is a perspective view of a RF array coil system in accordance with another exemplary embodiment of the present invention.
Figure 8:
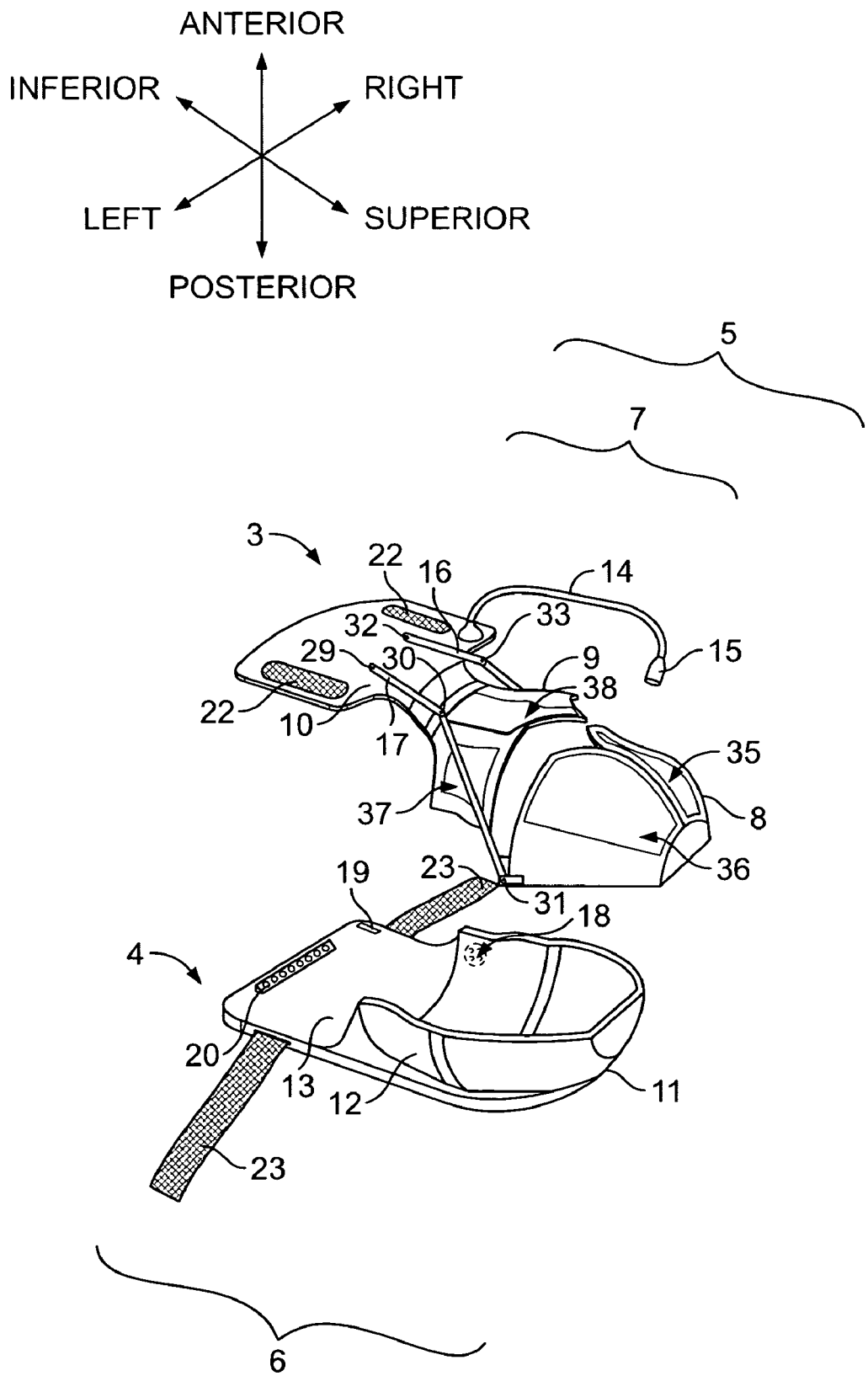
FIG. 8 is a perspective view of a RF array coil system in accordance with another exemplary embodiment of the present invention.
Figure 9:
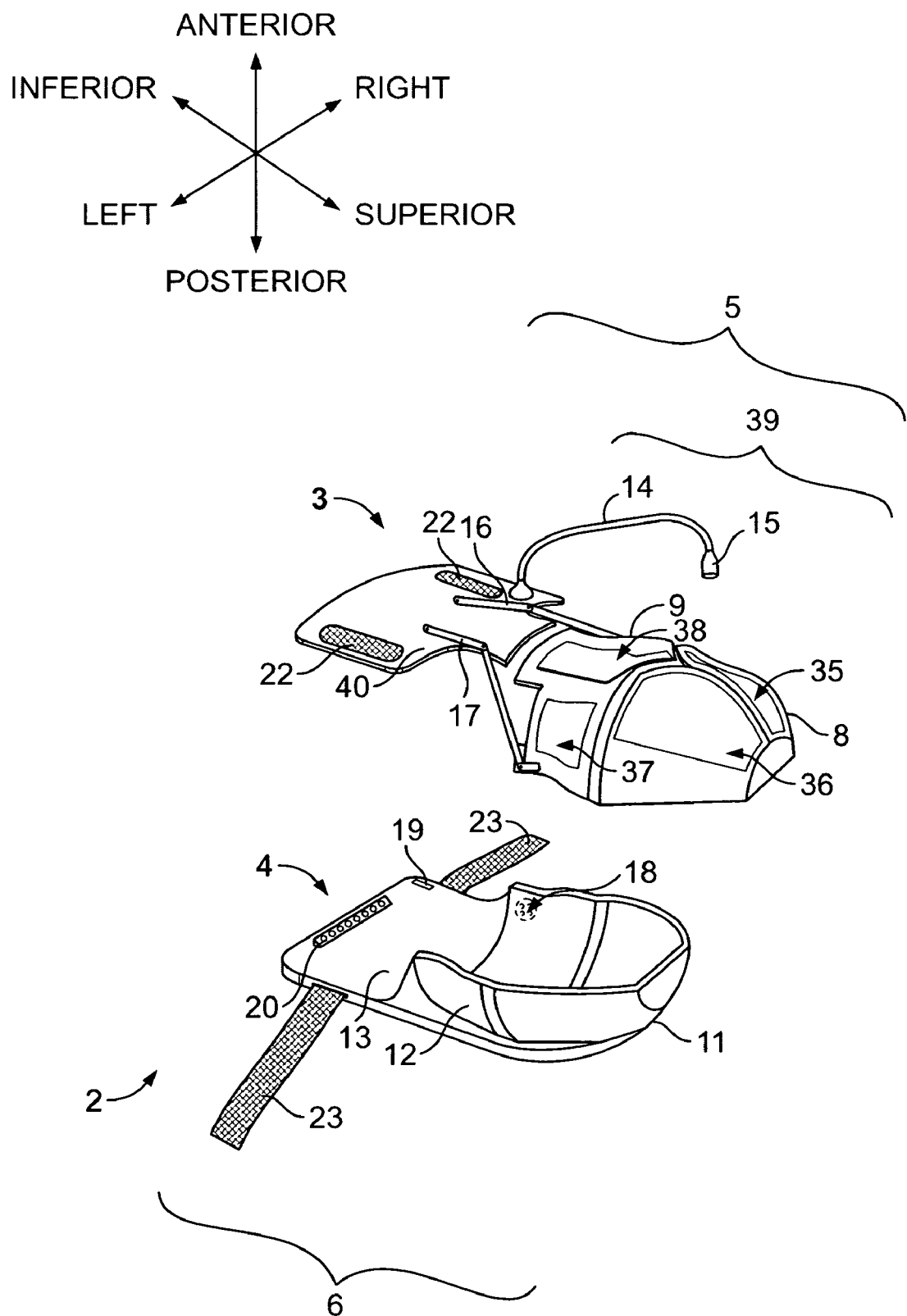
FIG. 9 is a perspective view of a RF array coil system in accordance with another exemplary embodiment of the present invention.
Figure 18:
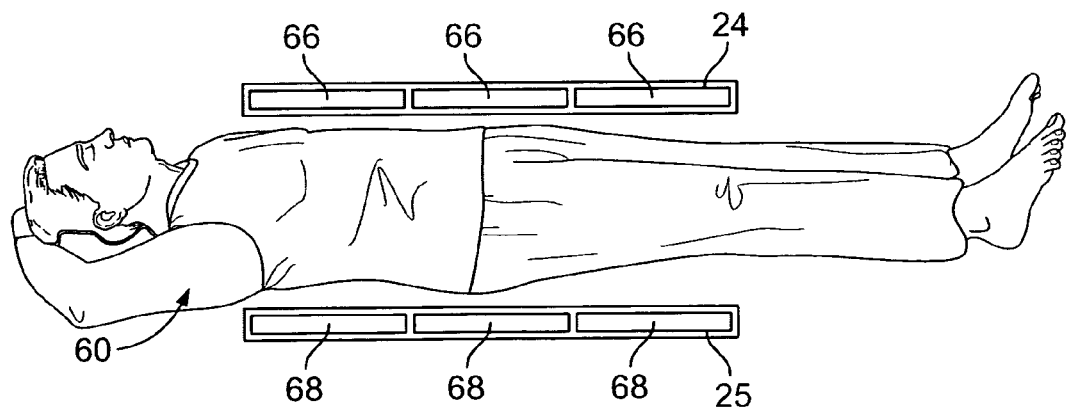
FIG. 18 is a side elevation view of a RF array coil system in accordance with another exemplary embodiment of the present invention.

It should be noted that the four sections 5, 6, 24 and 25 of the RF array coil systems 1 and 2 may be used together, as shown in FIGS. 1 and 5, to provide neurovascular, cervical-thoracic-lumber spine (CTL) and torso/cardiac imaging functions. Based on, for example, the imaging requirements, a system or coil package or arrangement may include one or more of the sections. FIGS. 6 and 7 show embodiments of the present invention having three pieces or sections, and more particularly, the main anterior coil section 5, the main posterior coil section 6 and the secondary posterior coil section 25, which may be used, for example, for neurovascular and CTL spine imaging. FIGS. 8 and 9 show embodiments of the present invention having two pieces or sections (e.g., a two-piece package), and more particularly, the main anterior and posterior coil sections 5 and 6, which may be used, for example, for neurovascular and neck/c-spine imaging. Another embodiment with only secondary anterior and posterior sections 24 and 25, which may be used, for example, for torso imaging, is illustrated in FIG. 18.

Figure 10:
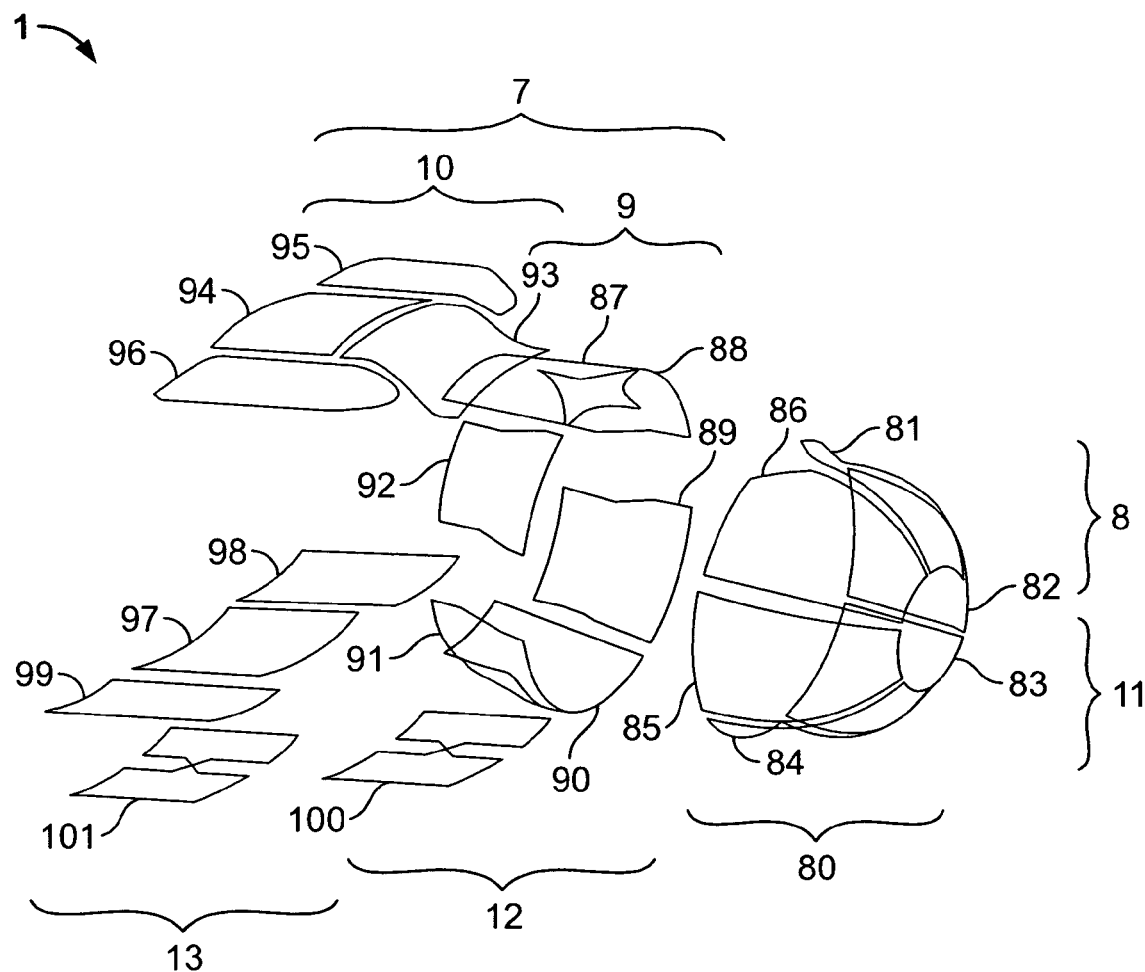
FIG. 10 is a schematic diagram of coil elements in accordance with an exemplary embodiment of the present invention.
Figure 11:
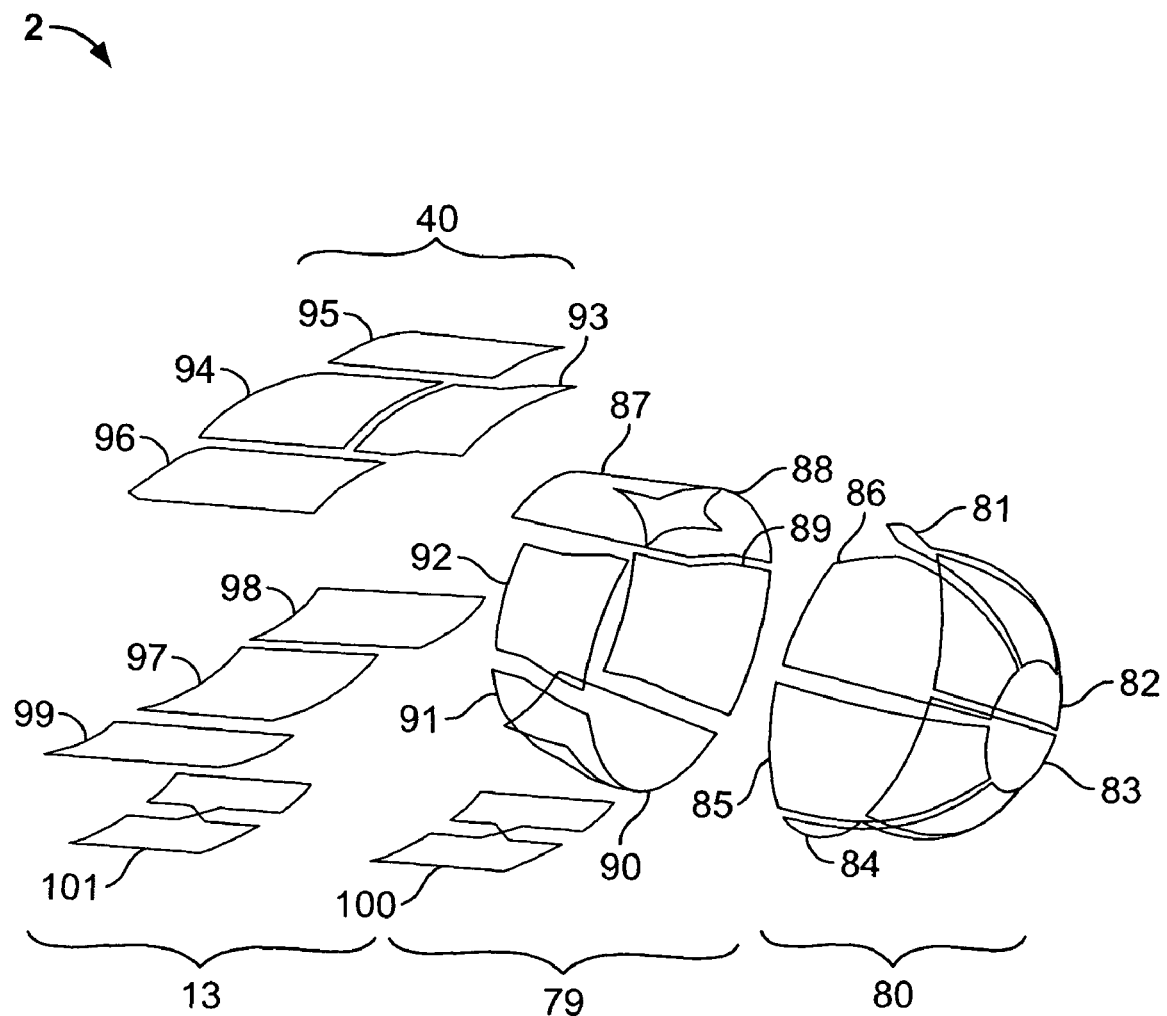
FIG. 11 is a schematic diagram of coil elements in accordance with another exemplary embodiment of the present invention.

The electrical arrangement of the RF array coil systems 1 or 2, include a plurality of coil elements, for example, at least twenty-nine coil elements, with at least twenty-one coil elements for the main coil sections, as shown in FIGS. 10 and 11, and at least eight coil elements for the secondary coil sections, as shown in FIGS. 12 through 18. In one embodiment as shown in FIG. 10, twenty-one coil elements are provided, including nineteen loop coils 81, 82, 83, 84, 85, 86, 87, 88, 89, 90, 91, 92, 93, 94, 95, 96, 97, 98 and 99, and two saddle coils 100 and 101, for the main coil sections of the RF array coil system 1. The dome-shaped brain coil section 80 includes six loop coils 81, 82, 83, 84, 85 and 86. The anterior neck-torso section 7 includes seven loop coils 87, 88, 92, 93, 94, 95 and 96, the three loop coils 87, 88 and 92 for the anterior neck coil section 9 and the four loop coils 93, 94, 95 and 96 for the anterior torso section 10. The posterior neck and torso coil sections 12 and 13 include six loop coils 89, 90, 91, 97, 98 and 99 and two saddle coils 100 and 101, with the three loop coils 89, 90 and 91 and one saddle coil 100 for the posterior neck coil section 12 and the three loop coils 97, 98 and 99 and one saddle coil 101 for the posterior torso section 13. Two quadrature (QD) coil pairs are formed by the two saddle coils 100 and 101 and the two loop coils 90 and 97 for the posterior neck and torso sections 12 and 13.

In another embodiment, the main coil sections of the RF array coil system 2, shown in FIG. 11, also include a plurality of coil elements, for example, twenty-one coil elements, including nineteen loop coils 81, 82, 83, 84, 85, 86, 87, 88, 89, 90, 91, 92, 93, 94, 95, 96, 97, 98 and 99, and two saddle coils 100 and 101. The six loop coils 81, 82, 83, 84, 85 and 86 are provided for the dome-shaped brain coil section 80, six loop coils 87, 88, 89, 90, 91 and 92 and one saddle coil 100 are provided for the neck coil section 79. The anterior torso coil section 40 includes four loop coils 93, 94, 95 and 96 and the posterior torso coil section 13 includes three loop coils 97, 98 and 99, and one saddle coil 101. Two quadrature (QD) pairs are formed by the two saddle coils 100 and 101 and the two loop coils 90 and 97 for the posterior neck and torso sections 12, 13.

Each of the coil elements of the RF array coil systems 1 and 2 may be physically separate from its adjacent coil element, for example, by a gap of about 0.5 cm to about three cm as shown in FIGS. 10 and 11. In this embodiment, the mutual inductance between the adjacent coil elements may be minimized using transformers and/or preamplifier decoupling. In another embodiment, each of the coil elements of the RF array coil systems 1 and 2 may have overlap with its adjacent coils (not shown) to critically decouple itself from its nearest adjacent coil. In both embodiments, the isolation between the next nearest adjacent coils and the coils facing each other is dependent on preamplifier decoupling.

Figure 12:
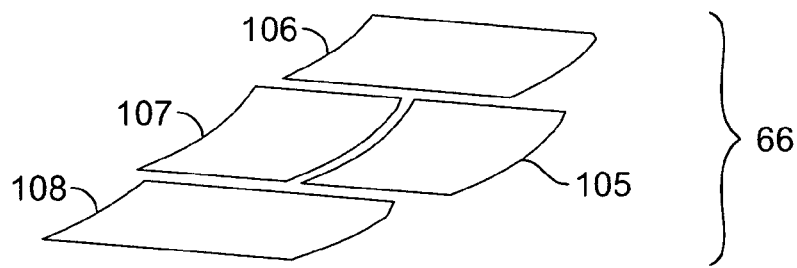
FIG. 12 is a schematic diagram of coil elements in accordance with another exemplary embodiment of the present invention.
Figure 13:
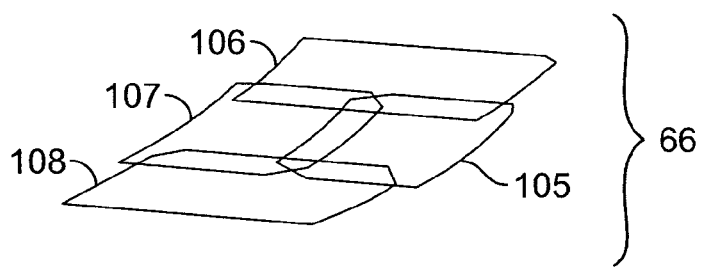
FIG. 13 is a schematic diagram of coil elements in accordance with another exemplary embodiment of the present invention.
Figure 14:
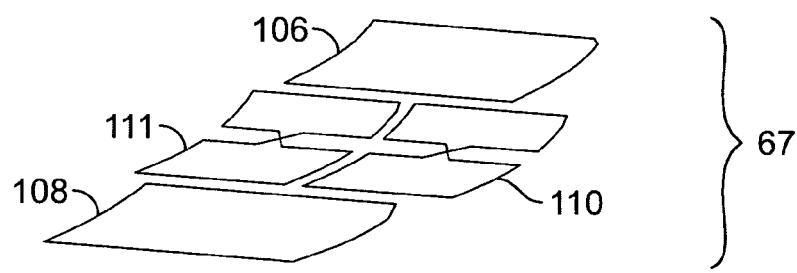
FIG. 14 is a schematic diagram of coil elements in accordance with another exemplary embodiment of the present invention.
Figure 15:
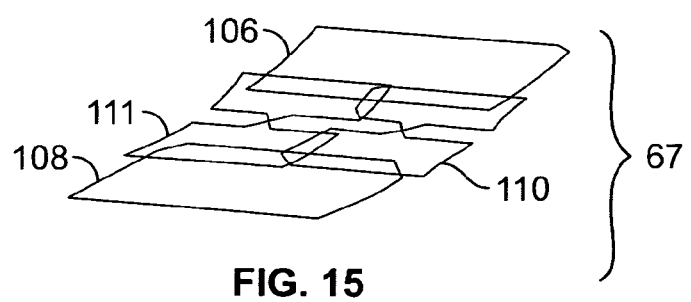
FIG. 15 is a schematic diagram of coil elements in accordance with another exemplary embodiment of the present invention.
Figure 16:
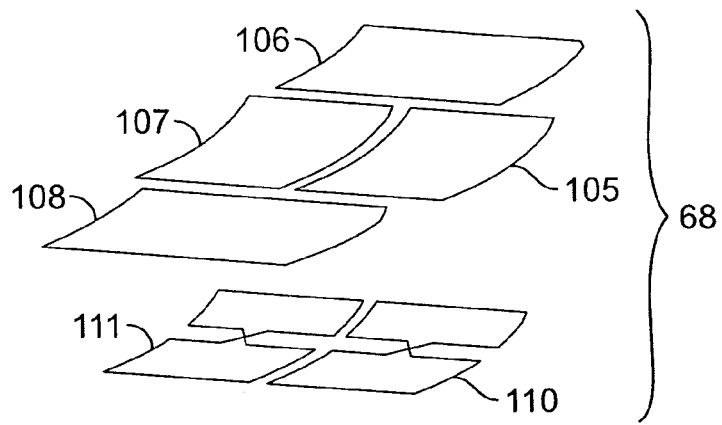
FIG. 16 is a schematic diagram of coil elements in accordance with another exemplary embodiment of the present invention.
Figure 17:
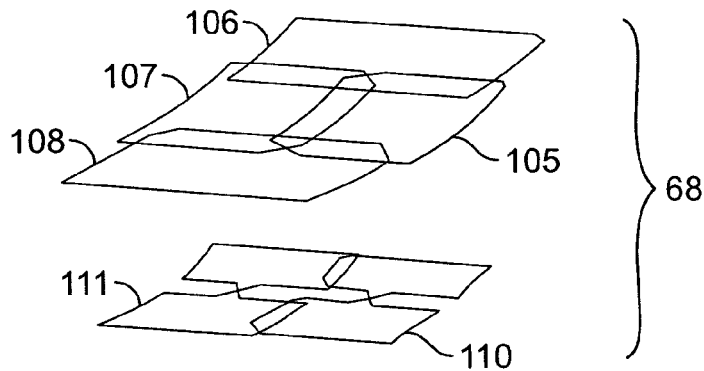
FIG. 17 is a schematic diagram of coil elements in accordance with another exemplary embodiment of the present invention.

The electrical circuit arrangement or layout with four coil elements 93, 94, 95 and 96 shown in FIGS. 10 and 11 may be used for the main anterior torso coil section 10 and 40. This arrangement 66, as also illustrated in FIGS. 12 and 13, includes four loop coils 105, 106, 107 and 108. The middle two loop coils 105 and 107 are arranged in the superior-inferior direction and the two loop coils 106 and 108 are positioned on the left and right sides of the two middle coils. More particularly, loop coils 106 and 108 sandwich the two middle loop coils 105 and 107. FIG. 12 illustrates four loop coils 105, 106, 107 and 108 that are separate from each other, while FIG. 13 illustrates four loop coils that overlap with its nearest neighbors (e.g., adjacent coils). In other embodiments as shown in FIGS. 14 and 15, an arrangement 67 includes two saddle coils 110 and 111 that may be used to replace the middle two loop coils 105 and 106. Further, the two saddle coils 110 and 111 may be added into the four-loop coil arrangement to form a six-element arrangement 68 shown in FIGS. 16 and 17. In this six-element arrangement, the two saddle coils 110 and 111 form two quadrature pairs with the two middle loop coils 105 and 106. It should be noted that the posterior neck and torso coil sections 12 and 13 shown in FIGS. 10 and 11 include this six-element arrangement 68 having the four loop coils 90, 97, 98 and 99 and two saddle coils 100 and 101. The two quadrature pairs, formed by the two saddle coils 100 and 101 and the two middle loop coils 90 and 97, distribute in the superior-inferior direction and are sandwiched by the two loop coils 98 and 99.

Figure 19:
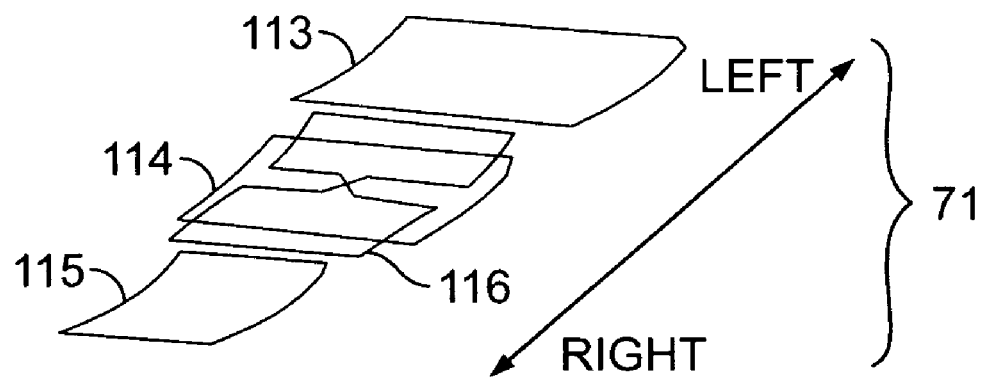
FIG. 19 is a schematic diagram of coil elements in accordance with another exemplary embodiment of the present invention.
Figure 20:
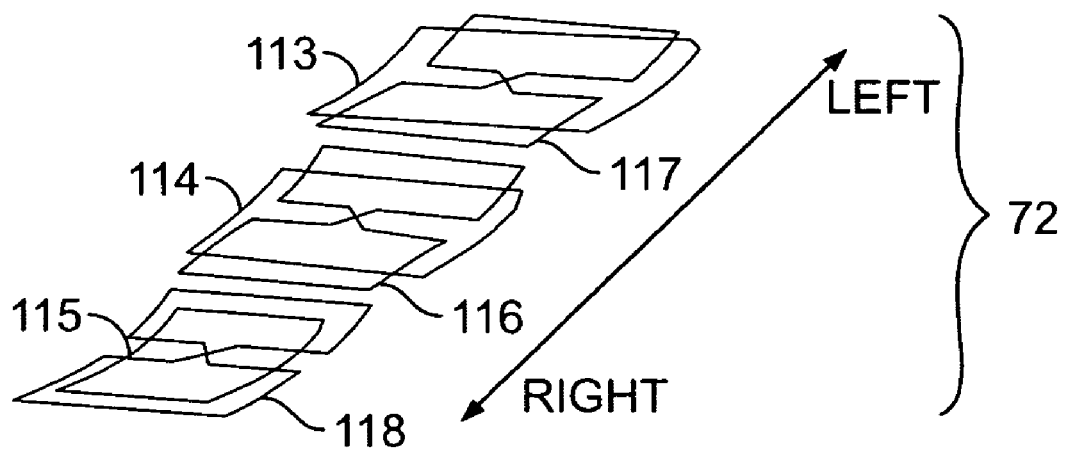
FIG. 20 is a schematic diagram of coil elements in accordance with another exemplary embodiment of the present invention.

FIG. 18 shows another embodiment of the present invention with a RF array coil system having only the secondary anterior and posterior coil sections 24 and 25 for torso and pelvis imaging. In this embodiment, the secondary anterior coil section 24 includes three four-element arrangements 66 and the posterior coil section 25 includes three six-element arrangements 68. The main posterior torso coil section 13, shown in FIGS. 10 and 11, includes another four-element arrangement that is formed by three loop coils 97, 98 and 99 and one saddle coil 101. This four-element arrangement 71 is also illustrated in FIG. 19. In FIG. 19, the saddle coil 116 and the middle loop coil 114 form a quadrature pair that is sandwiched by the two loop coils 113 and 115 on both the left and right sides. The size of each of the four coil elements may or may not be the same. Two more saddle coils 117 and 118 may be added to the four-element arrangement 71 to form another six-element arrangement 72, as shown in FIG. 20. In this six-element arrangement 72, the three saddle coils 117, 116 and 118 and the three loop coils 113, 114 and 115 form three quadrature coil pairs that are arranged in the left-right direction.

Figure 21:
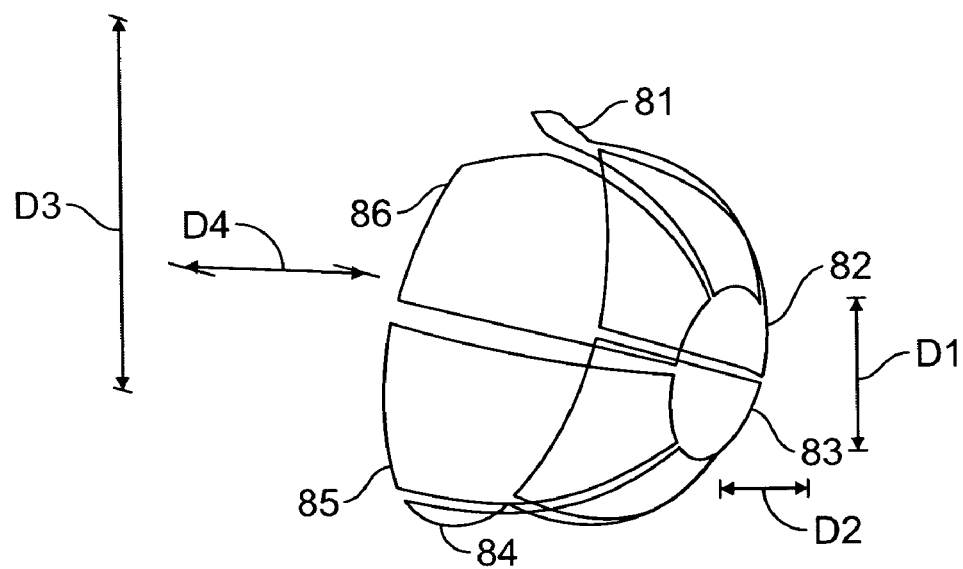
FIG. 21 is a schematic diagram of coil elements in accordance with another exemplary embodiment of the present invention.

In various embodiments, the six loop coils 81, 82, 83, 84, 85 and 86 of the brain coil section 80 are tapered at the superior end to form a dome-shaped, birdcage-like configuration, as shown in FIGS. 10, 11 and 21. In these embodiments, the cross-section of the superior end of the brain coil section 80 is generally oval-shaped, shown in FIG. 21, with a long-axis D1 of about three to about eight cm along the anterior-posterior direction and a short-axis D2 of about two to about seven cm along the left-right direction. The cross-section of the inferior end of the brain coil section 80 is also generally oval-shaped with a long-axis D3 of about twenty-three to about twenty-nine cm along the anterior-posterior direction and a short-axis D4 of about twenty-one to about twenty-seven cm along the left-right direction.

Figure 22:
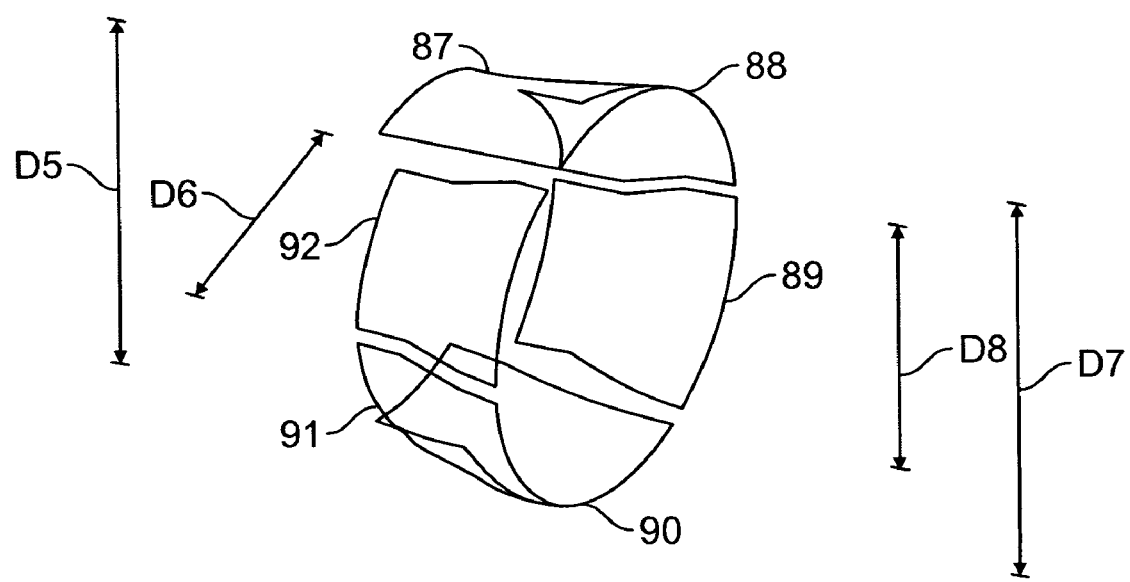
FIG. 22 is a schematic diagram of coil elements in accordance with another exemplary embodiment of the present invention.

In other various embodiments, the six loop coils 87, 88, 89, 90, 91 and 92 of the neck coil section 12 are tapered at the inferior end, as shown in FIGS. 11 and 19. In these embodiments, the cross-section of the inferior end of the neck section 12 is generally oval-shaped, shown in FIG. 22, with a long-axis D5 of about nineteen to about twenty-five cm along the anterior-posterior direction and a short-axis D6 of about sixteen to about twenty-three cm along the left-right direction. The cross-section of the superior end of the neck coil section 12 is also generally oval-shaped, with a long-axis D7 of about twenty-three to about twenty-nine cm along the anterior-posterior direction and a short-axis D8 of about twenty-one to about twenty-seven cm along the left-right direction.

Figure 23:
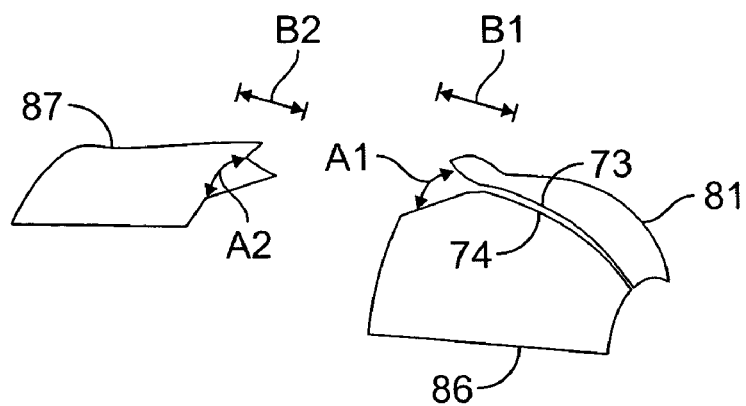
FIG. 23 is a schematic diagram of coil elements in accordance with another exemplary embodiment of the present invention.
Figure 24:
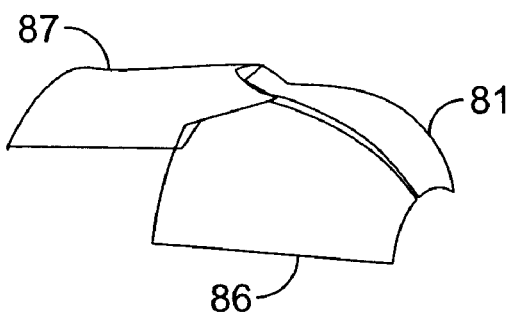
FIG. 24 is a schematic diagram of coil elements in accordance with another exemplary embodiment of the present invention.
Figure 25:
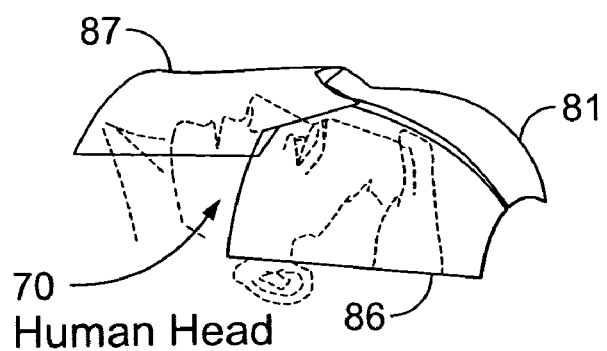
FIG. 25 is a schematic diagram of coil elements in accordance with another exemplary embodiment of the present invention.

In other various embodiment, the two loop coils 81 and 86 of the anterior brain coil section 8 and the middle loop coil 87 of the anterior neck section 9, for example, are configured to clear the region for a patient's nose as shown in FIGS. 23 through 25. In FIG. 23, the two adjacent conductors 73 and 74 of the loop coils 81 and 86, along a middle line from the superior end toward the inferior end of the anterior brain coil 8, start to bend toward right and left, respectively, when they reach the nose region. The two bent conductors 73 and 74 form a triangle-like shape at the nose region with an angle A1 of about twenty degrees to about sixty degrees and have a distance B1 of about two to about twelve cm in the superior-inferior direction. The superior side of the middle loop coil 87 of the anterior neck coil section 9 also has a triangle-like curve, similar to that formed by the two bent conductors 73 and 74, with an angle A2 of about twenty degrees to about sixty degrees and a distance B2 of about two to about twelve cm in the superior-inferior direction. The two triangle-like curves may overlap as shown in FIG. 24. FIG. 25 shows an embodiment wherein the conductors of the three anterior loop coils 81, 86 and 87 configured to extend, for example, around the eye and nose regions to keep these regions clear for a patient's eyes and nose.

Figure 26:
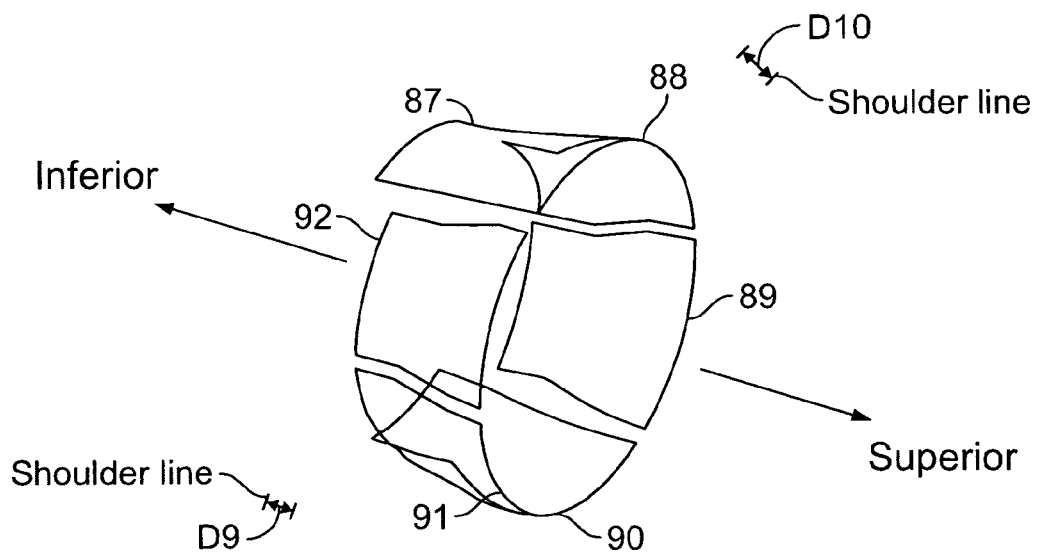
FIG. 26 is a schematic diagram of coil elements in accordance with another exemplary embodiment of the present invention.

Another embodiment of the anterior and posterior middle loop coils 87 and 90 of the neck coil section 79 is shown in FIG. 26. In this embodiment, the inferior sides of the anterior and posterior middle loop coils 87 and 90 of the neck coil section 79 extend beyond the shoulder line toward the inferior direction for a distance D9 and D10 of about two to about ten cm. A similar arrangement is also provided for the saddle coil 100 of the posterior neck coil section 12 shown in FIGS. 10 and 11. Specifically, the inferior side of the saddle coil 100 also extends beyond the shoulder line toward the inferior direction for a distance of about two to about ten cm.

Thus, the main coil sections, for example, the main anterior and posterior sections 5 and 6, of the RF array coil system 1 or 2 provide a plurality of channels/coil elements, for example, twenty-one channels/coil elements to image the head, neck and torso regions of a human body.

The six coil elements 81, 82, 83, 84, 85 and 86 of the brain coil section 80 and the seven coil elements 87, 88, 89, 90, 91, 92 and 100 of the neck coil section 79 distribute in the anterior-posterior and left-right directions, as well as in the superior-inferior direction. Therefore, SENSE imaging is possible in all the three directions for head imaging when both the brain and neck coil sections 80 and 79 are used. The arrangement for the four anterior torso coil elements 93, 94, 95 and 96 allow two coil elements 93 and 94 to distribute in the superior-inferior direction and three coil elements 95, 94/93 and 96 to distribute in the left-right direction. A similar arrangement for the six posterior neck-torso coil elements 90, 100, 98, 97, 99 and 101 is provided and distribute four coil elements 90, 100, 97 and 101 in the superior-inferior direction and four coil elements 98, 90, 100 and 99 or 98, 97, 101 and 99 in the left-right direction. In operation, when both the anterior and posterior torso coil sections 40 and 13 are used, 3D SENSE imaging also may be performed for torso/cardiac imaging. The coil elements, for example, the fifteen coil elements of the neck, anterior and posterior coil sections 13, 40 and 79 can provide higher reduction factor for 3D neck/carotid SENSE imaging. Thus, 3D SENSE imaging is provided for vascular imaging from the circle of Willis to aortic arch when all the twenty-one coil elements of the four coil sections are used. By attaching the secondary posterior torso coil section 25 with multiple stations of the six-element arrangement 68, SENSE imaging for spine in both the left-right and superior-inferior directions also may be provided. Further attaching the secondary anterior torso coil section 24 allows SENSE imaging in the anterior-posterior direction for spine imaging and enhances SNR of spine imaging.

Figure 27:
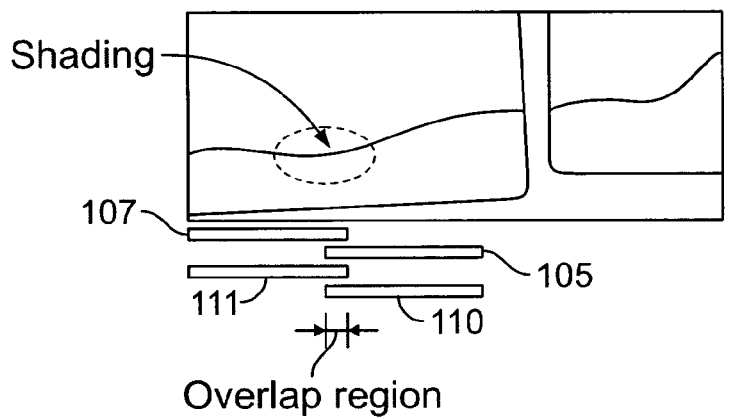
FIG. 27 is a perspective view of a RF array coil system in accordance with another exemplary embodiment of the present invention.
Figure 28:
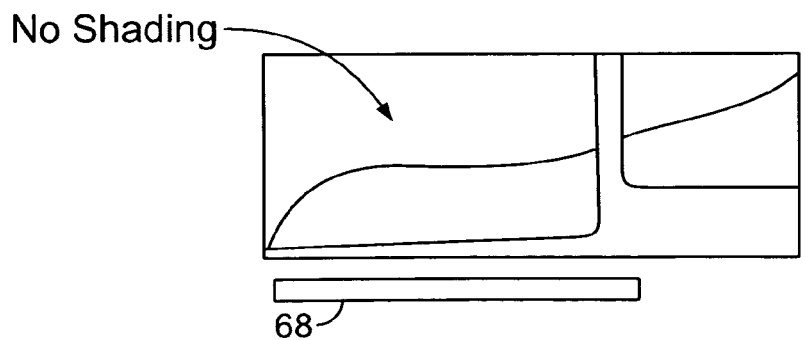
FIG. 28 is a perspective view of a RF array coil system in accordance with another exemplary embodiment of the present invention.

The dedicated neck coil section 79 and the arrangements for the three anterior and posterior middle coil elements 87, 90 and 100 of the neck coil section that extend the three coil elements beyond the shoulder line toward the inferior direction, reduce the shading of neck imaging. As shown in FIG. 27, when two coil stations are arranged along the superior-inferior direction (e.g., along the main Bo field direction), such as the two middle loop coils 105 and 107 in FIG. 13 and the two middle quadrature coil pairs 105, 110, 107 and 111 in FIG. 17, shading may occur for the image at the overlap region of the two coil stations due to the signal drop-off at the region. This shading is demonstrated in FIG. 27 for two quadrature coil pairs 105, 110, 107 and 111 distributed along the $B_0$ field direction. The various embodiments of the present invention, including the four-element arrangements 66 and 67 and the six-element arrangement 68 allow two additional coil elements 106 and 108 to be positioned at the left and right sides of the two middle coil stations, respectively, such that the strongest signal regions of the two additional coil elements are located at the overlap region of the two middle coil stations. As a result, the signal of the two additional coil elements 106 and 108 reduces the image shading by compensating for signal drop-off of the two middle coil stations at the overlap region. This is shown in FIG. 28 for imaging with a six-element arrangement 68. The signals from the two left and right loop coils 106 and 108 compensate for signal drop-off of the two middle quadrature coil pairs 105, 110, 107 and 111 at their overlap region and reduce or eliminate the shading.

Therefore, various embodiments of the present invention improve the image uniformity for spine imaging in the superior-inferior direction. Further, the arrangement of three coil stations in the left-right direction, as shown in FIGS. 12 through 17, and 19 and 20 also provide improved image uniformity in the left-right direction for spine imaging.

The flexible/semi-flexible design for the anterior neck-torso coil section 7 also makes it easier for the anterior neck-torso coil section to fit to different sizes and shapes of patients. This allows the coil elements in the anterior neck and torso sections be positioned closer to the region of interest (e.g., neck and chest), such that the SNR of neck, carotid and c-spine imaging will be improved due to the improvement of the filling factor of the coil elements.

The step-shaped mechanical formers, shown in FIGS. 2, 3 and 4, allow the anterior neck coil elements to overlap with the posterior neck and brain coil elements to achieve critical coupling such that the adjacent anterior and posterior coil elements can be isolated from each other.

The two-piece arrangement (e.g., the main anterior and posterior coil sections 5 and 6) provide neurovascular coils for head, neck/c-spine and vascular imaging. By attaching the secondary posterior torso coil section 25 to the main coil sections, imaging functions are expanded to TL spine region and, a three-piece neurovascular-CTL coil results. When all the four sections of the RF array coil system 1 or 2 (e.g., the main anterior and posterior coil sections 5 and 6 and the secondary anterior and posterior coil sections 24 and 25) are used, cardiac and torso imaging are possible. Therefore, the RF array coil systems 1 and 2 provide whole body coverage using multiple scans without re-positioning a patient between consecutive scans. Further, the secondary anterior and posterior pieces 24 and 25 can be used separately from the main coil sections to provide cardiac, torso and TL spine imaging.

Additionally, multiple windows 35, 36, 37 and 38 and the arrangement for the conductors of the anterior coil elements around the eye and nose regions of the head coil, as shown in FIG. 1, reduce the claustrophobic feeling of a patient.

Thus, various embodiments of the present invention provide a multiple channel RF array coil system (e.g., multiple coil element arrangement) providing higher SNR and improved image coverage. Various embodiments of the present invention also provide a RF array system having sensitivity encoding in the x, y, and z directions for different imaging modes. For example, in operation, three-dimensional SENSE imaging is provided for head imaging, torso/cardiac imaging, neck/carotid imaging, spine imaging, and vascular imaging from the Circle of Willis to aortic arch. Using a dedicated neck section also reduces the shading neck imaging.

Various embodiments of the present invention also provide a RF array system having improved image uniformity for spine imaging in both superior-inferior and left-right directions. Improved filling factor of the neck coil to enhance the SNR of neck, carotid and c-spine imaging also is provided. Thus, the anterior neck and torso sections may be constructed to a flexible or semi-flexible design that can be positioned on the neck and chest of a patient to fit different sizes and shapes of patients.

The anterior neck coil elements further are isolated from the coil elements of posterior neck and brain sections. Additional imaging functions are provided, such as, for example, cardiac imaging, torso imaging, thoracic and lumber (TL) spine imaging. A more patient friendly coil arrangement is additionally provided having an open design that is less claustrophobic, easier to position on a patient and more comfortable to the patient.

It should be noted that the configuration, shape, size, arrangement and type of coils may be modified as desired or needed, for example, based upon the type of MRI scanner. Additionally, the number of sections and/or coil elements may be changed, for example, increased or decreased, as desired or needed based upon the type of MRI scan to be performed (e.g., head, neurovascular, spine, whole-body, etc.). Thus, additional sections, pieces or coil elements may be added or removed from the system as desired or needed.

While the invention has been described in terms of various specific embodiments, those skilled in the art will recognize that the invention can be practiced with modification within the spirit and scope of the claims.

What is claimed is:

1. A MRI array coil system comprising:
an anterior coil section provided on a former and having a main anterior coil section, including an anterior brain coil section, and at least one secondary anterior coil section provided on a different former, the formers being physically separable from and removably attachable to each other; and
a posterior coil section provided on a former and having a main posterior coil section, including a posterior brain coil section, and at least one secondary posterior coil section provided on a different former, the formers being physically separable from and removably attachable to each other.

2. A MRI array coil system in accordance with claim 1 wherein the anterior brain coil section comprises a generally dome-shaped anterior brain coil section.

3. A MRI array coil system in accordance with claim 2 wherein the generally dome-shaped anterior brain coil section is provided on a rigid former.

4. A MRI array coil system in accordance with claim 1 wherein the posterior brain coil section comprises a generally dome-shaped posterior brain coil section.

5. A MRI array coil system in accordance with claim 4 wherein the generally dome-shaped posterior brain coil section is provided on a rigid former.

6. A MRI array coil system in accordance with claim 1 wherein the main anterior coil section comprises an anterior neck-torso coil section having an anterior neck coil and an anterior torso coil.

7. A MRI array coil system in accordance with claim 6 further comprising at least one arm and wherein the main anterior coil section comprises a generally dome-shaped anterior brain coil section, the at least one arm configured to connect the anterior neck-torso coil section to one of the anterior brain coil section and the main posterior coil section.

8. A MRI array coil system in accordance with claim 7 wherein the at least one arm is configured to allow the anterior neck-torso coil section to move in at least one of a superior-inferior direction, an anterior-posterior direction and a tiled direction.

9. A MRI array coil system in accordance with claim 6 further comprising securing members to secure the anterior neck-torso coil section to a patient.

10. A MRI array coil system in accordance with claim 1 wherein the main posterior coil section comprises a posterior neck-torso coil section having a posterior neck coil and a posterior torso coil.

11. A MRI array coil system in accordance with claim 1 wherein the secondary coil sections are configured in a floating type arrangement for removable attachment to a patient.

12. A MRI array coil system in accordance with claim 1 further comprising connectors for electrically connecting at least a portion of the anterior coil section to at least a portion of the posterior coil section.

13. A MRI array coil system in accordance with claim 1 wherein the anterior coil section and posterior coil section are configured to allow overlap of coil elements.

14. A MRI array coil system in accordance with claim 1 wherein the anterior and posterior coil sections together comprise at least twenty-nine coil elements, with twenty-one coil elements in the main sections.

15. A MRI array coil system in accordance with claim 14 wherein the coil elements include at least one of loop coils, saddle coils and quadrature pairs of coils.

16. A MRI array coil system in accordance with claim 1 wherein the anterior and posterior coil sections are configured having at least one of a two-element arrangement, a four-element arrangement and a six-element arrangement.

17. A MRI array coil system in accordance with claim 1, wherein the anterior brain coil section comprises a generally dome-shaped anterior brain coil section and the posterior brain coil section comprises a generally dome-shaped posterior brain coil section, with the brain coil sections configured having a generally oval-shaped cross-section at a superior end and at an inferior end and wherein the anterior brain coil section is removably attachable to the posterior brain coil section.

18. A method for controlling an MRI system, said method comprising:
configuring an anterior coil section to have a main anterior coil section on a former, including an anterior brain coil section, and at least one secondary anterior coil section on a former, the formers being physically separable and removably attachable to each other; and
configuring a posterior coil section to have a main posterior coil section on a former, including a posterior brain coil section, and at least one secondary posterior coil section on a former, the formers being physically separable and removably attachable to each other.

19. A MRI array coil system in accordance with claim 1 wherein coils elements forming the anterior brain coil section are physically separate from coil elements forming the secondary anterior coil section and coils elements forming the posterior brain coil section are physically separate from coil elements forming the secondary anterior coil section.

20. A MRI array coil system in accordance with claim 1 wherein at least one of the anterior coil section or the poster coil section comprises a pair of detachable connectors electrically connecting the main coil section to the secondary coil section.

* * * * *

UNITED STATES PATENT AND TRADEMARK OFFICE
CERTIFICATE OF CORRECTION

| | | |
|---|---|---|
| PATENT NO. | : 8,046,046 B2 | Page 1 of 1 |
| APPLICATION NO. | : 10/828157 | |
| DATED | : October 25, 2011 | |
| INVENTOR(S) | : Chan et al. | |

It is certified that error appears in the above-identified patent and that said Letters Patent is hereby corrected as shown below:

In Column 8, Line 46, delete "thoracic-lumber" and insert -- thoracic-lumbar --, therefor.

In Column 13, Line 15, delete "lumber" and insert -- lumbar --, therefor.

In Column 14, Line 61, in Claim 20, delete "poster" and insert -- posterior --, therefor.

Signed and Sealed this
Sixth Day of March, 2012

David J. Kappos
*Director of the United States Patent and Trademark Office*